(12) United States Patent
Asami et al.

(10) Patent No.: US 9,875,803 B2
(45) Date of Patent: Jan. 23, 2018

(54) MEMORY SYSTEM AND METHOD OF CONTROLLING NONVOLATILE MEMORY

(71) Applicant: Toshiba Memory Corporation, Minato-ku (JP)

(72) Inventors: Shohei Asami, Yokohama (JP); Toshikatsu Hida, Yokohama (JP)

(73) Assignee: TOSHIBA MEMORY CORPORATION, Minato-ku (JP)

(*) Notice: Subject to any disclaimer, the term of this patent is extended or adjusted under 35 U.S.C. 154(b) by 0 days.

(21) Appl. No.: 15/065,264

(22) Filed: Mar. 9, 2016

(65) Prior Publication Data

US 2017/0076807 A1    Mar. 16, 2017

Related U.S. Application Data

(60) Provisional application No. 62/216,769, filed on Sep. 10, 2015.

(51) Int. Cl.
| | | |
|---|---|---|
| *G06F 11/10* | (2006.01) | |
| *G11C 16/26* | (2006.01) | |
| *G11C 29/52* | (2006.01) | |
| *G11C 16/04* | (2006.01) | |
| *G11C 29/42* | (2006.01) | |

(52) U.S. Cl.
CPC .......... *G11C 16/26* (2013.01); *G06F 11/1068* (2013.01); *G11C 29/52* (2013.01); *G11C 16/0483* (2013.01); *G11C 29/42* (2013.01)

(58) Field of Classification Search
CPC .................................................. G06F 11/1076
USPC ........................................ 714/764, 767, 772
See application file for complete search history.

(56) References Cited

U.S. PATENT DOCUMENTS

| | | | |
|---|---|---|---|
| 7,242,618 B2 | 7/2007 | Shappir et al. | |
| 7,903,468 B2 | 3/2011 | Litsyn et al. | |
| 8,073,648 B2 | 12/2011 | Shlick et al. | |
| 8,811,094 B2 * | 8/2014 | Lee ...................... | G11C 11/5628 365/185.22 |
| 2012/0265927 A1 * | 10/2012 | Cho ...................... | G11C 11/5642 711/103 |

FOREIGN PATENT DOCUMENTS

| | | |
|---|---|---|
| JP | 2007-52907 | 3/2007 |
| JP | 2009-26436 | 2/2009 |

* cited by examiner

*Primary Examiner* — Fritz Alphonse
(74) *Attorney, Agent, or Firm* — Oblon, McClelland, Maier & Neustadt, L.L.P.

(57) ABSTRACT

According to one embodiment, a controller searches a threshold voltage distribution of first memory cells corresponding to a first processing unit that is one processing unit among a plurality of processing units, and acquires a first read voltage. The controller calculates a second read voltage that is a read voltage for second memory cells corresponding to a second processing unit based on the acquired first read voltage and a first relation. The controller reads data from third memory cells included in the second memory cells by using the calculated second read voltage.

20 Claims, 14 Drawing Sheets

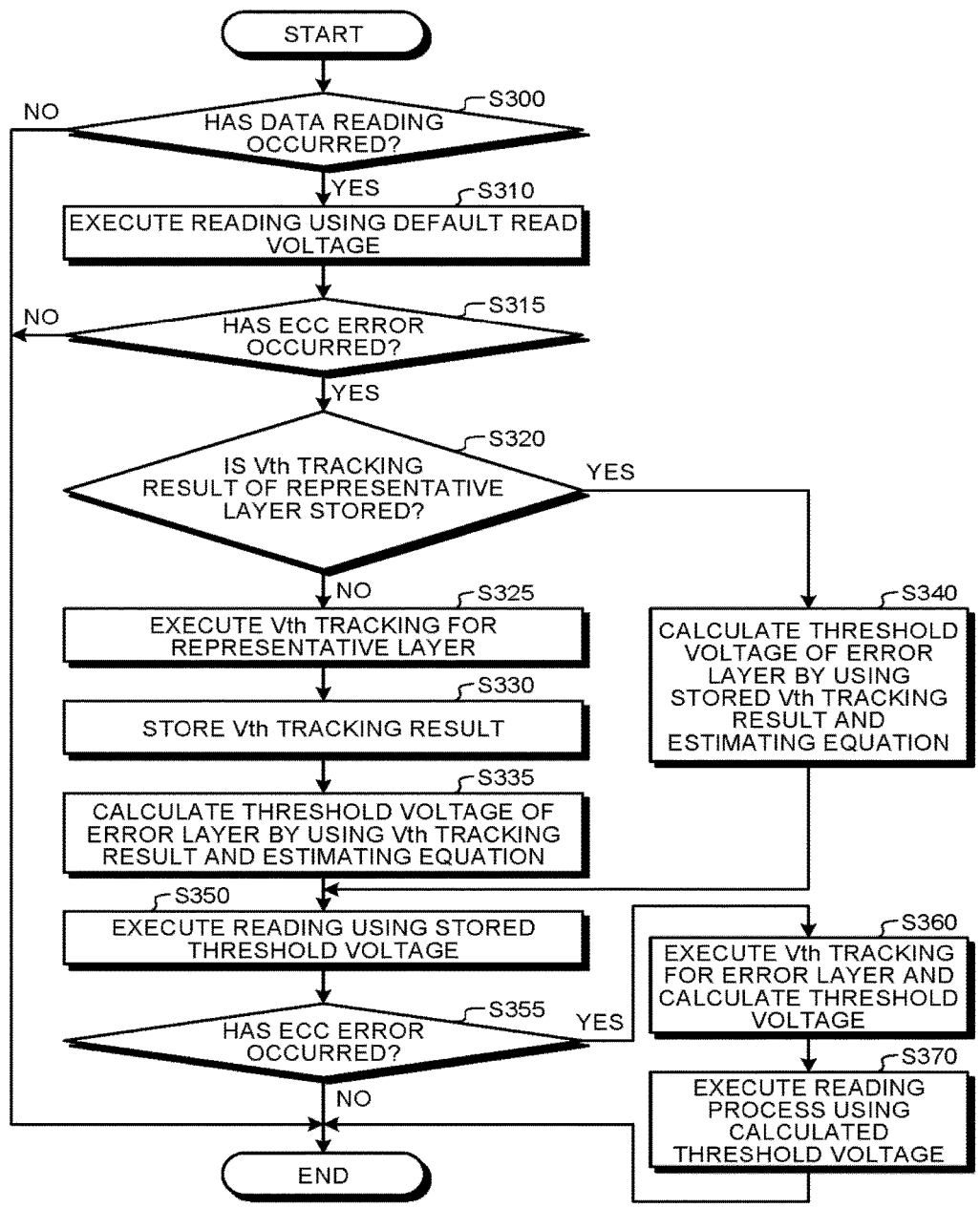

MEMORY SYSTEM AND METHOD OF CONTROLLING NONVOLATILE MEMORY

CROSS-REFERENCE TO RELATED APPLICATIONS

This application is based upon and claims the benefit of priority from U.S. Provisional Application No. 62/216,769, filed on Sep. 10, 2015; the entire contents of which are incorporated herein by reference.

FIELD

Embodiments described herein relate generally to a memory system including a nonvolatile memory and a method of controlling a nonvolatile memory.

BACKGROUND

In a NAND flash memory, information is stored according to the amount of electric charge accumulated in a floating gate of a memory cell. The stored information is read by applying a read voltage to the memory cell. However, there are cases where the distribution of the amount of electric, charge accumulated in the floating gate of a memory cell changes from its initial state. In accordance with such a change, an optimal read voltage for which the number of reading errors is small changes.

BRIEF DESCRIPTION OF THE DRAWINGS

FIG. 14 is a flowchart that illustrates the operation according to the third embodiment.

DETAILED DESCRIPTION

According to this embodiment, a memory system includes a nonvolatile memory and a controller. The nonvolatile memory includes a plurality of blocks. The block includes a plurality of physical sectors. The physical sector includes memory cells connected to a same word line. The controller searches a threshold voltage distribution of first memory cells corresponding to a first processing unit that is one processing unit among a plurality of processing units, and acquires a first read voltage. The controller calculates a second read voltage based on the acquired first read voltage and a first relation. The second read voltage is a read voltage for second memory cells corresponding to a second processing unit. The first relation includes a deviation amount between a threshold voltage distribution of the first processing unit and a threshold voltage distribution of the second processing unit. The second processing unit is a processing unit excluding the first processing unit among the plurality of processing units. The controller reads data from third memory cells included in the second memory cells by using the calculated second read voltage.

Exemplary embodiments of memory system and a method of controlling a nonvolatile memory will be explained below in detail with reference to the accompanying drawings. The present invention is not limited to the following embodiments.

First Embodiment

Figure 1:
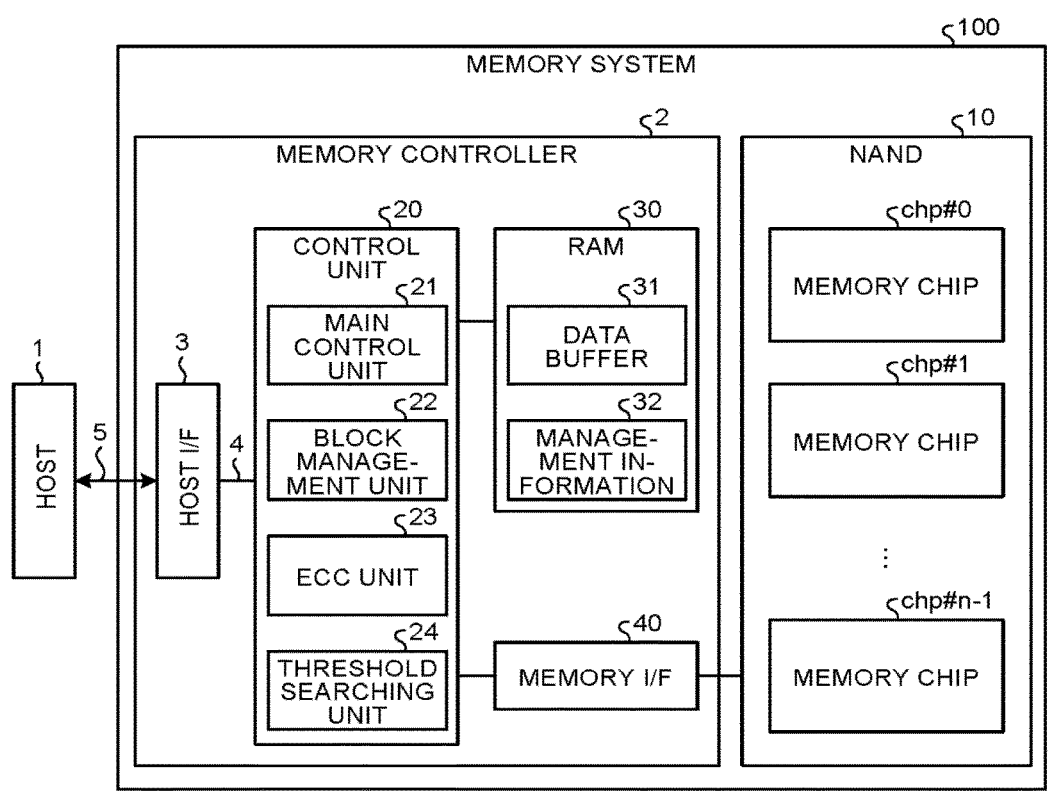
FIG. 1 is a functional block diagram that illustrates the internal configuration of a memory system.

FIG. 1 is a block diagram that illustrates an example of the configuration of a memory system 100 according to a first embodiment. The memory system 100 is connected to a host apparatus (hereinafter, abbreviated as a host) 1 through a communication line 5 and functions as an external storage device of the host 1. The host 1, for example, may be an information processing apparatus such as a personal computer, a mobile phone, or an imaging apparatus, may be a mobile terminal such as a tablet computer or a smart phone, a gaming device, or an in-vehicle terminal such as a car navigation system.

The memory system 100 includes: a NAND flash memory (hereinafter, abbreviated as a NAND memory) 10 as a nonvolatile memory; and a memory controller 2. The nonvolatile memory device is not limited to the NAND flash memory having a two-dimensional structure or a three-dimensional structure but may be another flash memory, a resistance random access memory (ReRAM), a ferroelectric random access memory (FeRAM), or the like.

Figure 2:
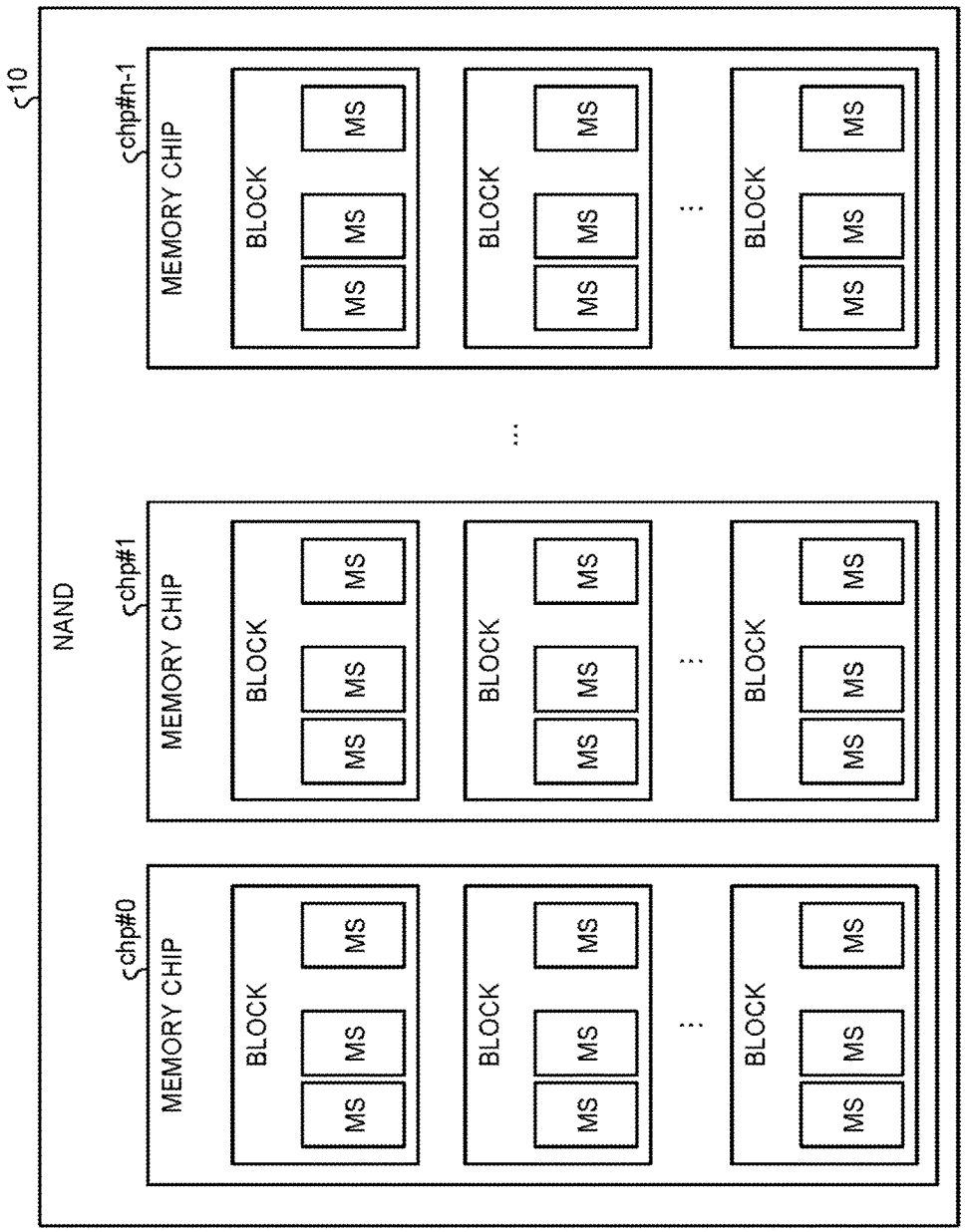
FIG. 2 is a block diagram that illustrates the internal configuration of a NAND flash memory.

The NAND 10, as illustrated in FIG. 2, includes one or more memory chips chp#0 to chp#n−1 each including a memory cell array. Each of the memory chips chp#0 to chp#n−1 includes the memory cell array. The memory cell array includes a plurality of memory cells arranged in a matrix pattern. The memory cell array includes a plurality of blocks that are units for data erasing. Each block is configured by a plurality of physical sectors MS.

Each memory cell can store multi-values. In a case where the memory cells are operated in a single level cell (SLC) mode, one physical sector MS corresponds to one page. On the other hand, in a case where the memory cells are operated in a multiple level cell (MCL) mode, one physical sector MS correspond to paces (here, N is a natural number of two or more). In a case where N=2, one physical sector MS corresponds to two pages (a lower page and an upper page), and, in a case where N=3, one physical sector MS corresponds to three pages (a lower page, a middle page, and an upper page). A page is a unit for writing and reading data.

Figure 3:
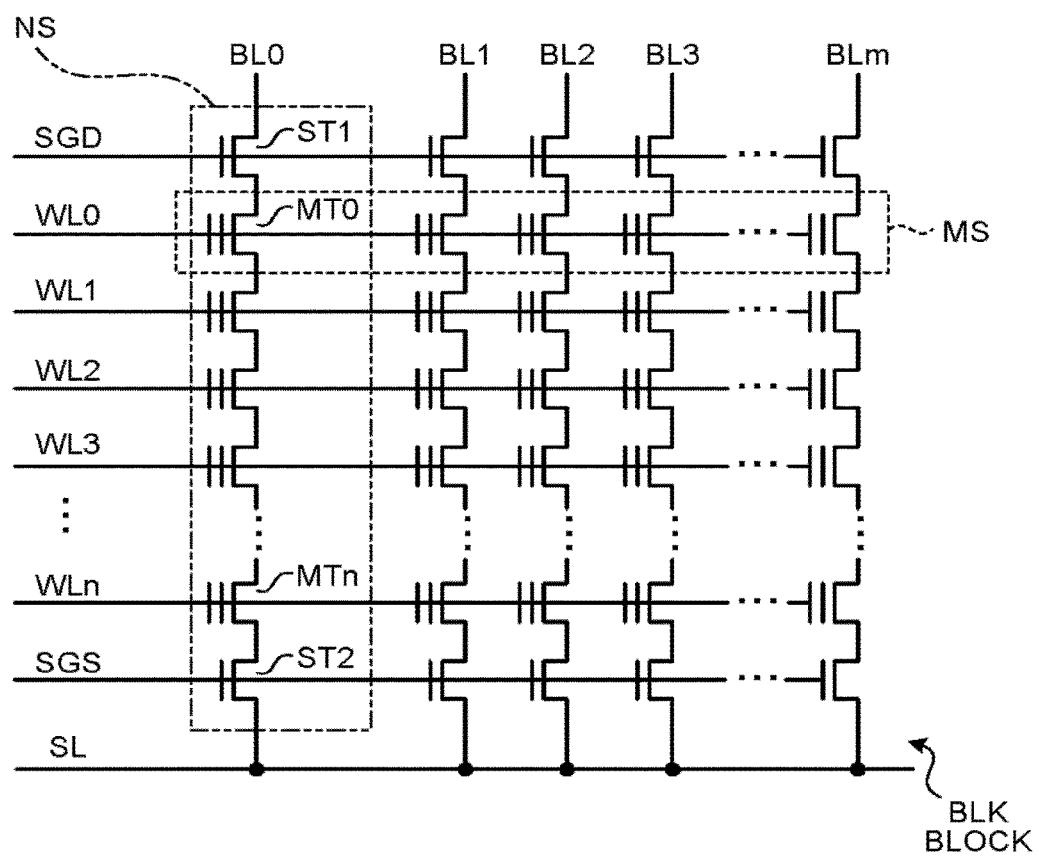
FIG. 3 is a circuit diagram that illustrates the internal configuration of a NAND flash memory having a two dimensional structure to which a first embodiment is applied.

The memory cell array that is the premise of the first embodiment is not particularly limited to a specific configuration but may be a memory cell array having a two-dimensional structure as illustrated in FIG. 3 or a memory cell array having a three-dimensional structure to be described later or may employ any other configuration.

FIG. 3 is a diagram that illustrates an example of the configuration of a block of the memory cell array having a two-dimensional structure. FIG. 3 illustrates one of a plurality of blocks that configure the memory cell array having the two-dimensional structure. The other blocks of the memory cell array have the same configuration as that illustrated in FIG. 3. As illustrated in FIG. 3, the block BLK of the memory cell array includes (m+1) (here, m is an integer or 0 or more) NAND strings NS. Each NAND string NS shares a diffusion region (a source region or a drain region) between memory cell transistors MT adjacent to each other. Each NAND string NS includes: (n+1) (here, n is an integer of 0 or more) memory cell transistors MID to MTn connected in series; and selection transistors ST1 and ST2 arranged at both ends of the column of the (n+1) memory cell transistors MT0 to MTn.

Word lines WL0 to WLn are respectively connected to control gate electrodes of the memory cell transistors MT0 to MTn that configure the NAND string NS, and, memory cell transistors MTi (here, i=0 to n) included in each NAND string NS are connected to be common using the same word line WLi (here, i=0 to n). In other words, the control gate electrodes of the memory cell transistors MTi disposed in the same row within the block BLK are connected to the same word line WLi.

Each of the memory cell transistors MT0 to MTn is configured by a field effect transistor having a stacked gate structure on a semiconductor substrate. Here, the stacked gate structure includes: a charge storage layer (floating gate electrode) formed on the semiconductor substrate with a gate insulating film being interposed therebetween; and a control gate electrode formed on the charge storage layer with an inter-gate insulating film being interposed therebetween. A threshold voltage of each of the memory cell transistors MT0 to MTn changes according to the number of electrons storable in the floating gate electrode and thus, can store data according to a difference in the threshold voltage.

Bit lines BL0 to BLm are respectively connected to the drains of (m+1) selection transistors ST1 within one block BLK, and a selection gate line SGD is connected to be common to the gates of the selection transistors. In addition, the source of the selection transistor ST1 is connected to the drain of the memory cell transistor MT0. Similarly, a source line SL connected to be common to the sources of the (m+1) selection transistors ST2 within one block BLK, and a selection gate line SGS is connected to be common to the gates of the selection transistors. In addition, the drain of the selection transistor ST2 is connected to the source of the memory cell transistor MTn.

Each memory cell is connected not only to the word line but also to the bit line. Each memory cell can be identified by using an address used for identifying a word line and an address used for identifying a bit line. As described above, the data of the plurality of memory cells (the memory cell transistors MT) disposed within the same block BLK is erased altogether. On the other hand, data is written and read in units of physical sectors M. One physical sector MS includes a plurality of memory cells connected to one word line.

In a read operation and a programming operation, one word line is selected according to the physical address, and one physical sector MS is selected. A switching of the page within this physical sector MS is performed using the physical address.

Referring back to FIG. 1, the configuration of the memory system 100 will be described. The user data transmitted from the host 1, the management information of the memory system 100, firmware (not illustrated in the diagram), and the like are stored in the NAND 10. The firmware operates a CPU (not illustrated in the diagram) realizing at least a part of the function of the control unit 20 of the memory controller 2. The firmware may be stored in a ROM not illustrated in the diagram. The management information includes a logical/physical translation table, a block management table, and the like.

The memory controller 2 includes: a host interface 3; a memory interface 40; a RAM 30; and a control unit 20. In this embodiment, while the RAM 30 is arranged inside the memory controller 2, the RAM 30 may be arranged outside the memory controller 2. The host I/F 3 outputs a command, user data (write data), and the like received from the host 1 to an internal bus 4. In addition, the host I/F 3 transmits the user data read from the NAND 10, a response from the control unit 20, and the like to the host 1. The memory I/F 40 directly controls the NAND 10 based on a instruction from the control unit 20.

The RAM 30 is a volatile semiconductor memory that can be accessed at a higher speed than the NAND 10. The RAM 30 includes a storage area as a data buffer 31. Data received from the host 1 is temporarily stored in the data buffer 31 before being written into the BAND 10. Data read from the NAND 10 is temporarily stored in the data buffer 31 before being transmitted to the host 1. The management information stored in the NAND 10 is loaded into the RAM 30. The management information 32 loaded into the RAM 30 is backed up into the NAND 10. The RAM 30 also functions as a buffer in which the firmware stored in the NAND 10 is loaded. As the RAM 30, a static random access memory (SRAM) or a dynamic random access memory (DRAM) is used.

The control unit 20 includes: a main control unit 21; a block management unit 22; an ECC unit 23; and a threshold searching unit 24. The function of the control unit 20 is realized by one or a plurality of CPUs (processors) executing firmware loaded in the RAM 30 and peripheral circuits thereof. The function of the main control unit 21 is realized by a CPU and/or hardware that executes firmware. The function of the block management unit 22 is realized by a CPU and/or hardware that execute firmware. The function of the ECC unit 23 is realized by a CPU and/or hardware that execute firmware. The function of the threshold searching unit 24 is realized by a CPU and/or hardware that execute firmware.

The main control unit 21 executes a process corresponding to a command received from the host 1 and the like. For example, in a case where a write request is received from the host 1, the main control unit 21 temporarily stores write data in the data buffer 31. When the data buffer 31 is full, for example, the main control unit 21 reads data stored in the data buffer and writes the read data into the NAND 10 through the ECC unit 23 and the memory I/F 40.

On the other hand, in a case where a read request is received from the host 1, the main control unit 21 instructs the memory I/F 40 to read data from the NAND 10. The memory I/F 40 temporarily stores the data read from the NAND 10 in the data buffer 31 through the FCC unit 23. The main control unit 21 transmits the read data stored in the data buffer 31 to the host 1 through the host I/F 3.

The main control unit 21 manages the user data by using a logical/physical translation table that is one of the management information 32 that is loaded into the RAM 30. In the logical/physical translation table, mapping associating a logical address used by the host 1 with the physical address of the NAND 10 is registered. As the logical address, for example, logical block addressing (LBA) is used. The physical address represents a storage position on the NAND 10 at which the data is stored.

Figure 4:
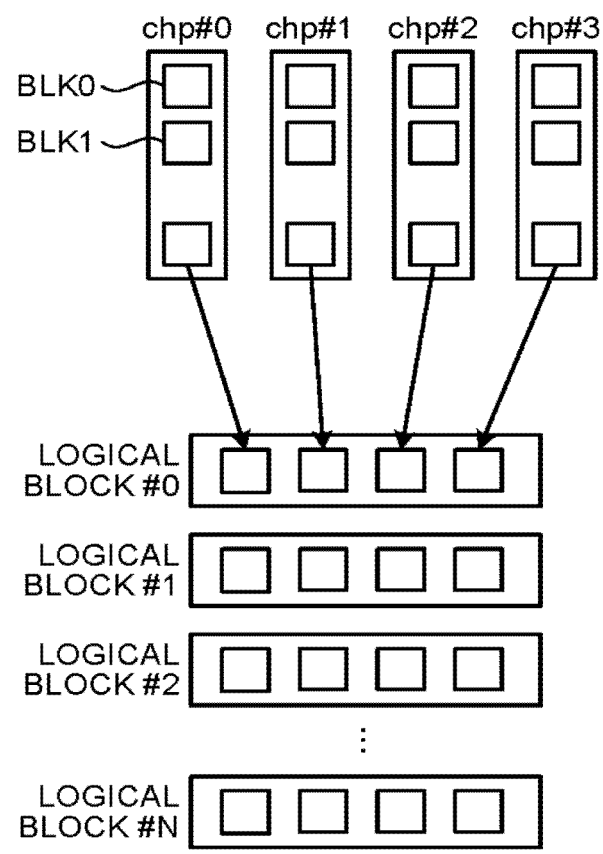
FIG. 4 is a diagram that illustrates an example of a change and a distribution of a threshold voltage.

The block management unit 22 manages blocks included in the NAND 10 by using the block management able that is one of the management information 32 loaded in the RAM 30. In the memory system 100, logical blocks that are virtual blocks are used as units for managing the blocks. The logical block is configured by collecting physical blocks from a plurality of memory chips #0 to #n−1. FIG. 4 illustrates an example of the configuration of the logical block. In this example, the number of memory chips is configured as four, and physical blocks are combined so as to enable chip parallelizing. In this case, the logical block is configured by a maximum of four physical blocks BLK. In addition, the logical blocks may be configured so as to enable plane parallelizing and/or bank interleaving.

The block management table, for example, manages the following block management information.
(1) IDs of a Plurality of Physical Blocks Configuring a Logical Block
(2) Erase Count in Units of Blocks
(3) Information Used for Identifying Whether a Logical Block is an Active Block or a Free Block
(4) Block Address of a Bad Block An active block is a block in which valid data is recorded. A free block is a block in which valid data has not been recorded and is reusable after erasing the data. The valid data is data associated with a logical address, and invalid data is data not associated with a logical address. When data is written into a free block after erasing data stored therein, free block becomes an active block. A bad block is an unusable block that does not normally operate due to various factors.

The ECC unit 23 executes an error correction coding process for data transmitted from the data buffer 31, thereby generating parity. The ECC unit 23 outputs a code word including data and parity to the memory I/F 40. The memory I/F 40 inputs the code word read from the NAND 10 to the FCC unit 23. The BCC unit 23 executes an error correction decoding process by using the input code word and transmits decoded data to the data buffer 31.

As a coding system executed by the ECC unit 23, any system may be used. For example, Reed Solomon (RS) coding, Bose Chaudhuri Hocguenghem (BCH) coding, low density parity check (LDPC) coding, or the like may be used.

The ECC unit 23 includes a first-level ECC unit and a second-level ECC unit that are at least two ECC processing units having mutually-different error correction capabilities. The error correction capability of the second-level ECC unit is higher than that of the first-level ECC unit. The error correction capability, for example, can be changed by changing the data size configuring a code word and/or the coding system. In a case where an error correction fails in the first-level FCC unit, an error correction is made by the second-level FCC unit.

Figure 5:
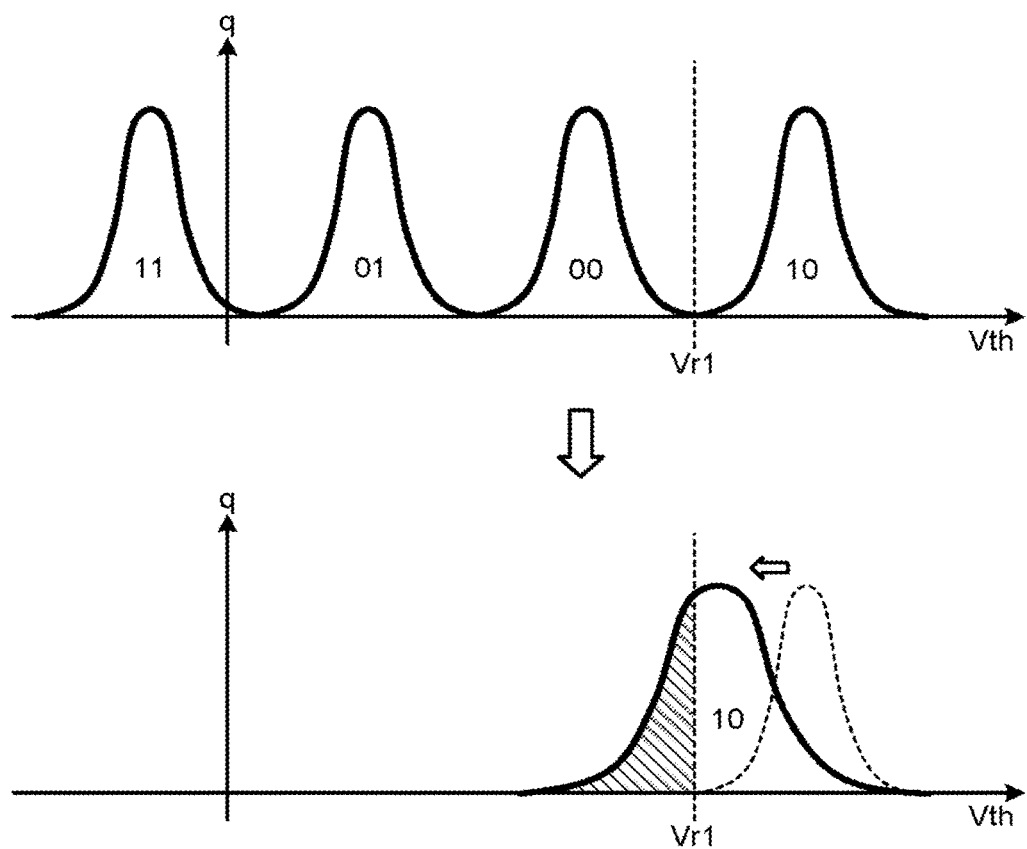
FIG. 5 is a diagram that conceptually illustrates a logical block.

In a flash memory, by programming a threshold voltage according to a data value recorded in a memory cell, data is recorded. FIG. 5 illustrates an example of a change in a threshold voltage Vth of the NAND 10 of 2-bit cells and a distribution thereof. An upper diagram of FIG. 5 illustrates the distribution of an initial state. The vertical axis represents the number q of memory cells, and the horizontal axis represents the threshold voltage Vth. A first mountain from the left side represents a distribution corresponding to "11". A second mountain from the left side represents a distribution corresponding to "01". A second mountain from the right side represents a distribution corresponding to "00". A first mountain from the right, side represents a distribution corresponding to "10". By reading data with a read voltage being appropriately set between the mounts, it can be identified whether each cell is programmed to the upper side or the lower side of the read voltage. FIG. 5 illustrates an example in which data is read with a voltage Vr1 being set as a read voltage for identifying cells programmed to "00" and "10". Here the correspondence relation between "11" to "00" and the threshold voltage Vth is not limited to that illustrated in FIG. 5, and any other correspondence relation may be set.

In the NAND 10 of 2-bit cells illustrated in FIG. 5, the number of used read voltages and the read count is different between the lower page and the upper page. In reading the lower page, reading is executed with a read voltage being set between the mounts of "01" and "00". In reading the upper page, reading is executed twice with read voltages being set at two places between mountains having mutually-different upper bits, in other words between the mountains of "11" and "01" and between the mountains "00" and "10". Thus, for the upper page, two kinds of read voltages are used.

On the other hand, in the NAND 10, there are error factors such as a data retention error, a read disturbing error, and program disturbing error. According to such an error factor, the amount of electric charge of the floating gate changes, and the distribution of the threshold voltage changes. For this reason, there are cases where a reading error occurs in a case where reading is executed by using a read voltage that is initially set. Hereinafter, the read voltage that is initially set will be referred to as a default read voltage. A lower diagram of FIG. 5 illustrates a state in which the distribution of the mountain of "10" is changed according to the error factor described above. A portion of the lower side of FIG. 5 to which hatching is applied represents a cell that is incorrectly identified from "10" to "00".

The threshold searching unit 24 illustrated in FIG. 1 operates when an error correction fails in the ECC unit 23. For example, when an error correction fails in the first-level ECC unit, the threshold searching unit 24 operates before an error correction is made by the second-level ECC unit. In other to reduce read error occurring in the FCC unit 23, the threshold searching unit 24 acquires a threshold voltage distribution (the shape of a mountain and a valley) of the current time point by searching a threshold voltage distribution of a memory cell group and sets the position of a valley disposed between mountains of the acquired threshold voltage distribution of the current time point as the read voltage. In order to acquire the threshold voltage distribution of the memory cell group, the threshold searching unit 24 executes a method called Vth tracking (or distribution read).

The Vth tracking is a method for executing reading using M read voltages and acquiring the number (frequency) of memory cells of which data is read as a data value "1". In the Vth tracking, the number of memory cells present between two read voltages is acquired as a frequency. For example, a threshold voltage is determined for each of a plurality of memory cells connected to a word line while the M read voltages are sequentially applied to the selected word line, and determination results are counted. By using the M read voltages, (M+1) frequencies are acquired. By interpolating the (M+1) frequencies, the shapes of mountains and valleys of the distribution are acquired. Then, a minimum value of the valleys is set as an optimal read voltage.

Here, in a comparative example, when an error correction of a code word fails in the ECC unit 23, the Vth tracking is executed for a memory cell group (for example, the physical sector MS or the block BLK) of a certain range in which the code word of which the error correction has failed is included. However, when a read error occurs, in a case where the Vth tracking is executed for a memory cell group including a code word in which the read error has occurred in detail, it takes time for a search for the threshold distribution, and accordingly, the reading performance is reduced.

Thus, in this embodiment, specific physical blocks that are targets for the Vth tracking are set among a plurality of physical blocks of which access environments are equal. The specific physical blocks that are targets for the Vth tracking are called representative physical blocks. A relation between the threshold voltage distributions (the amount of a deviation between the threshold voltage distributions) of the representative physical block and the other physical blocks is acquired in advance at the time of manufacturing as an estimating equation. It is assumed that a read error has occurred in a certain physical block among the plurality of physical blocks of which the access environments are equal. A block in which the read error has occurred will be referred to as an error block. First, the Vth tracking is executed for the representative physical block, and a result of the Vth tracking is acquired and stored. Next, a read voltage for the error block is calculated based on the acquired result of the Vth tracking and the estimating equation. Reading of the error block is re-executed by using the calculated read voltage. Thereafter, it is assumed that a read error has occurred in another physical block among the plurality of physical blocks of which the access environments are equal. At this time, a read voltage for the error block is calculated based on the stored result of the Vth tracking of the representative physical block and the estimating equation. Then, reading of the error block is re-executed by using the calculated read voltage.

In this way, according to the first embodiment, read voltages for the other physical blocks are calculated based on the result of the Vth tracking of the specific search target block (representative physical block) and the estimating equation. For this reason, the number of times of executing the Vth tracking is decreased, and the reading performance is improved.

Figure 6:
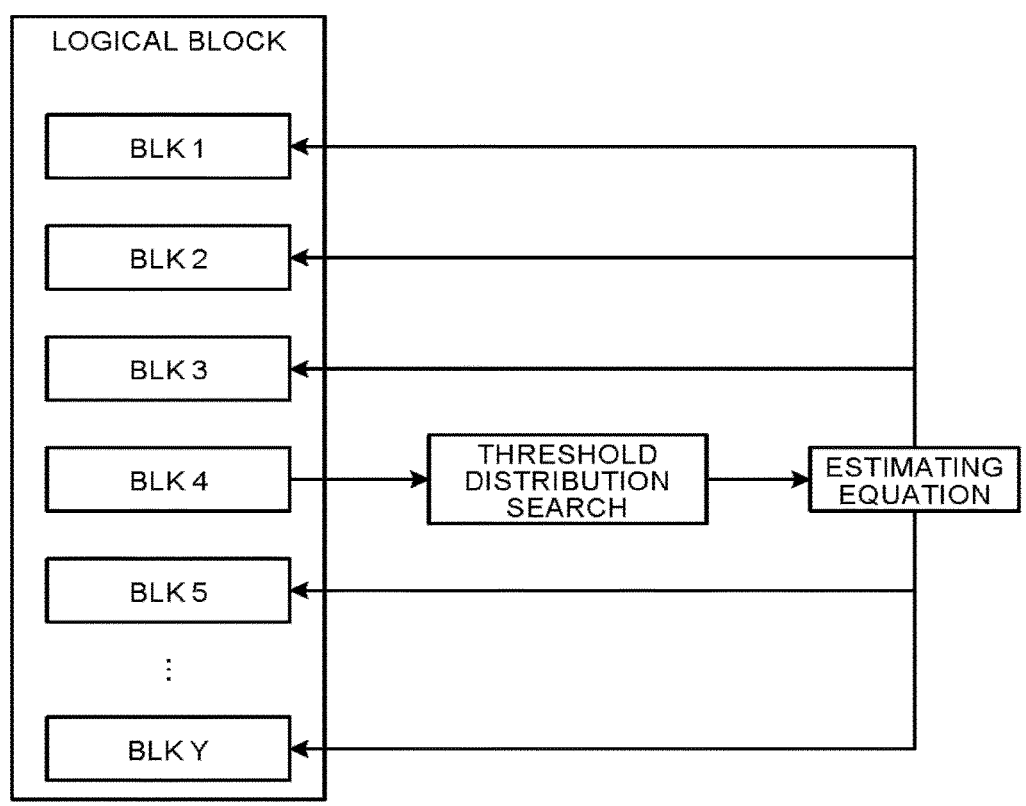
FIG. 6 is a diagram that conceptually illustrates an operation according to the first embodiment.

FIG. 6 is a diagram that conceptually illustrates the operation according to the first embodiment. In the case illustrated in FIG. 6, as the plurality of physical blocks of which the access environments are equal, a plurality of physical blocks included in a logical block are assumed. The plurality of physical blocks configuring a logical block are erased simultaneously and are used as logical blocks for writing data. Accordingly, the erase counts of the plurality of physical blocks configuring the logical block are the same. In addition, since data written at the same timing from the host 1 is recorded in the logical block, elapsed times after programming are almost the same. For example, in a case where data stored in one file is recorded in a plurality of physical blocks arranged inside a logical block, the read counts are also assumed to be equal. Thus, a plurality of physical blocks configuring a logical block have an equal access environment and have similar influences of the data retention, the read disturbing, and the programming disturbing described above.

The logical block illustrated in FIG. 6 includes a plurality of physical blocks BLK1 to BLKY. In this logical block, the physical block BLK4 is set as a searching target block (representative physical block) that is a target for the Vth tracking. Relations relating to the amounts of deviations between threshold voltage distributions of the representative physical block BLK4 and the other physical blocks BLK1 to BLK3 and BLK5 to BLKY are acquired in advance at the time of manufacturing and are set in the threshold searching unit 24 as an estimating equation. In a case where read errors occur in the physical blocks BLK1 to BLK3 and BLK5 to BLKY, read voltages for the physical blocks BLK1 to BLK3 and BLK5 to BLKY are calculated based on a result of the Vth tracking of the representative physical block BLK4 and the estimating equation described above.

In a manufacturing process before the shipment of the memory system 100, the manufacturer of the memory system 100 acquires relations relating to the amounts of deviations between the threshold voltage distributions of the representative physical block and the other physical blocks, for example, as an estimating equation in accordance with differences between physical positions of the representative physical block and the other physical blocks. This estimating equation, for example, is stored in the NAND 10 as the management information or is included in a processing algorithm executed by the threshold searching unit 24. The threshold searching unit 24 executes a process to be described later by using the estimating equation. In accordance with an erase count (or a write count) of the logical block, the deviation amounts between the threshold voltage distributions of the representative physical block and the other physical blocks may be changed.

Figure 7:
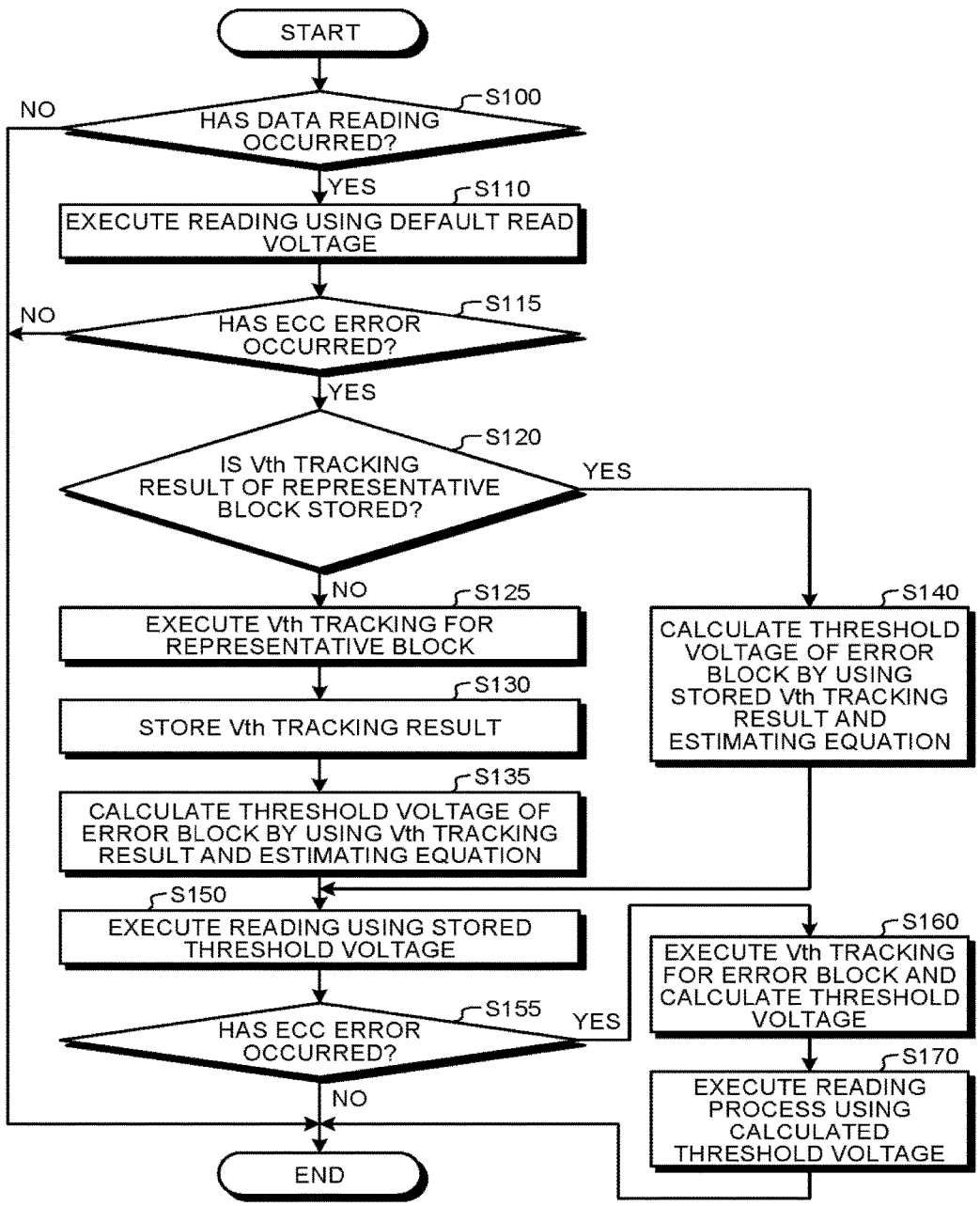
FIG. 7 is a flowchart that illustrates the operation according to the first embodiment.

FIG. 7 is a flowchart that illustrates an example of the operation of the memory system 100 according to the first embodiment. When reading of data stored in the NAND 10 has occurred (Step S100), the main control unit 21 executes control of the memory I/F 40 such that the data stored in the NAND 10 is read by using the default read voltage (Step S110). In a case where a read error occurs due to a failure in the error correction in the ECC unit 23 at the time of reading data using the default read voltage (Step S115: Yes), the threshold searching unit 24 determines whether or not a Vth tracking result relating to the representative physical block of a logical block to which a physical block (error block) including a page in which the read error has occurred belongs (Step S120).

In a case where the result of the determination of Step S120 is No, the threshold searching unit 24 executes the Vth tracking for the representative physical block of the logical block to which the error block belongs (Step S125) and stores an acquired result of the Vth tracking as the management information 32 (Step S130). The Vth tracking for the representative physical block may be executed for all the physical sectors included in the representative physical block or may be executed for one or a plurality of physical sectors included in the representative physical block. In a case where the Vth tracking is executed for one or a plurality of physical sectors included in the representative block, it is preferable to select one or a plurality of physical sectors having the same word line number as the word line number to which one or a plurality of physical sectors, in which the read error has occurred, of the physical block in which the read error has occurred are connected.

The Vth tracking result of the representative physical block that is stored as the management information 32 may be erased when the power of the memory system 100 is turned off or may be stored for a certain period. Here, the certain period, for example, is one day, several days, or several weeks. The certain period, for example, is calculated by counting the erase count of the logical block.

Next, the threshold searching unit 24 calculates a read voltage for an error block in which the read error has occurred based on the Vth tracking result of the representative physical block and the set estimating equation described above and notifies the main control unit 21 of the calculated new read voltage (Step S135). The main control unit 21 executes control of the memory I/F 40 such that a page, in which the read error has occurred, is read using the notified read voltage (Step S150).

At the time of reading data using this new read voltage, in a case where an error correction is successful in the ECC unit 23 (Step S155: No), the subsequent process is executed by using the read data. In a case where the result of the determination of Step S155 is Yes, the threshold searching unit 24 executes the Vth tracking not for the representative physical block but for a physical block (error block) including the page in which the read error has occurred, calculates a read voltage for the error block, and notifies the main control unit 21 of the calculated new read voltage (Step S160). The main control unit 21 executes control of the memory I/F 40 such that the page in which the read error has occurred is read by using the notified read voltage (Step S170).

On the other hand, in Step S120, in a case where a Vth tracking result relating to the representative physical block of the logical block to which the error block belongs is stored (Step S120: Yes), the threshold searching unit 24 calculates a read voltage for the error block in which the read error has occurred based on the stored Vth tracking result of the representative physical block and the set estimating equation described above and notifies the main control unit 21 of the calculated new read voltage (Step S140). The main control unit 21 executes control of the memory I/F 40 such that the page in which the read error has occurred is read by using the notified read voltage (Step S150). The processing sequence of such Steps S100 to S170 is executed when data stored in the NAND 10 is to be read.

In addition, in a case where the Vth tracking result of the representative physical block is stored, Steps S110 and S115 may be skipped.

In the description presented above, a case has been described in which the plurality of physical blocks, of which the access environments are equal, are a plurality of physical blocks included in a logical block. As the plurality of physical blocks of which the access environments are equal, a plurality of physical blocks in which data is written during a same period may be assumed. Here, the same period, for example, is several hours or one day. In a case where the host 1 is a notebook computer, a plurality of physical blocks in which data is written until the power is off after power-on may be assumed as the plurality of physical blocks in which data is written during the same period.

In this way, according to the first embodiment, read voltages for the other physical blocks are calculated based on the Vth tracking result of a specific representative physical block among the plurality of physical blocks of which the access environments are equal and the estimating equation. For this reason, the number of times of executing the Vth tracking is decreased, and the reading performance is improved.

Second Embodiment

In a second embodiment, Vth tracking for a plurality of physical sectors MS inside a physical block is representatively executed for a representative physical sector that is a specific physical sector inside the physical block. In other words, relations relating to the deviation amounts between the threshold voltage distributions of the representative physical sector and the other physical sectors are acquired in advance at the time of manufacturing as an estimating equation. It is assumed that a read error has occurred in a certain physical sector inside a physical block. Here, the physical sector in which the read error has occurred will be referred to as an error physical sector. First, the Vth tracking is executed for the representative physical sector, and a result of the Vth tracking is acquired and stored. Next, a read voltage for the error physical sector is calculated based on the result of the Vth tracking acquired as described above and the estimating equation described above. Reading of the error physical sector is re-executed by using the calculated read voltage. Thereafter, it is assumed that a read error has occurred in another physical sector inside the physical block. At this time, a read voltage for the error physical sector is calculated based on the result of the Vth tracking of the representative physical sector stored as described above and the estimating equation described above.

Figure 8:
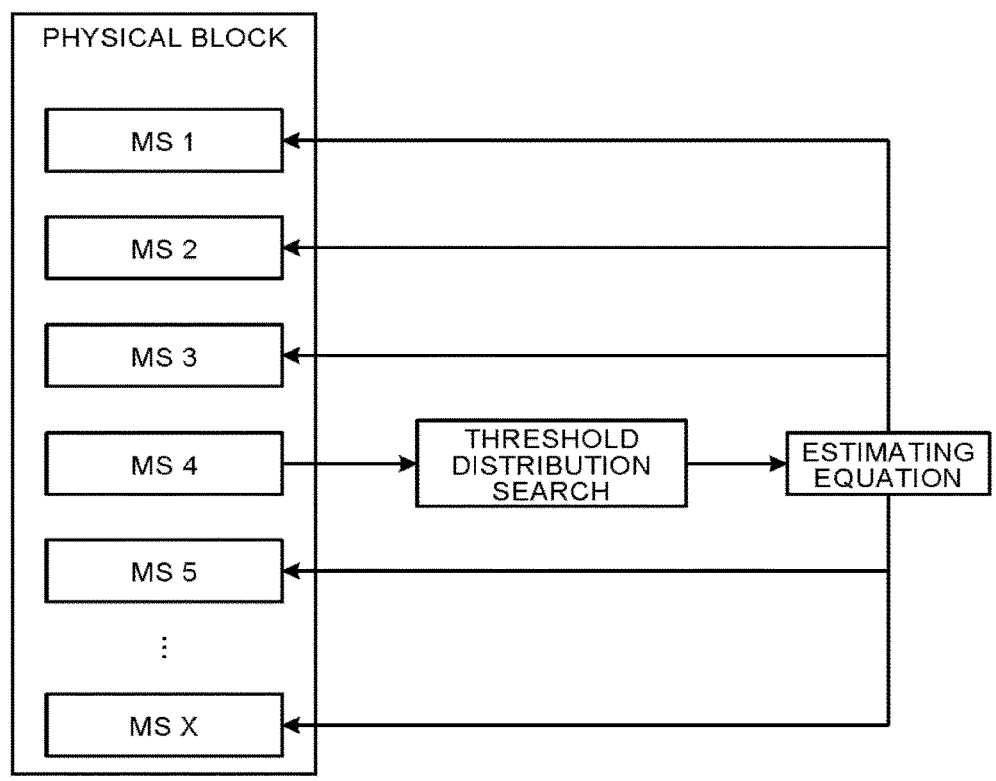
FIG. 8 is a diagram that conceptually illustrates an operation according to a second embodiment.

FIG. 8 is a diagram that conceptually illustrates an operation according to the second embodiment. A plurality of physical sectors MS disposed inside a physical block have an equal access environment and have similar influences of the data retention, the read disturbing, and the programming disturbing described above.

As illustrated in FIG. 8, a physical block includes a plurality of physical sectors MS1 to MSX. In this physical block, the physical sector MS4 is set as a physical sector (representative physical sector) that is a searching target as a target for the Vth tracking. Relations of the amounts of deviations between thresh voltage distributions according to differences the physical positions of the representative physical sector MS4 and the other physical sectors MS1 to MS3 and MS5 to MSX are acquired in advance according to an evaluation at the time of manufacturing or a process test and are set in the threshold searching unit 24 as an estimating equation. In a case where read errors occur in the physical sectors MS1 to MS3 and MS5 to MSX, read voltages for the physical sectors MS1 to MS3 and MS5 to MSX are calculated based on a result of the Vth tracking of the representative physical sector MS4 and the estimating equation described above. In accordance with the erase count (or the write count) of the physical block, the amounts of deviations of the threshold voltage distributions set as the estimating equation may be further changed.

Figure 9:
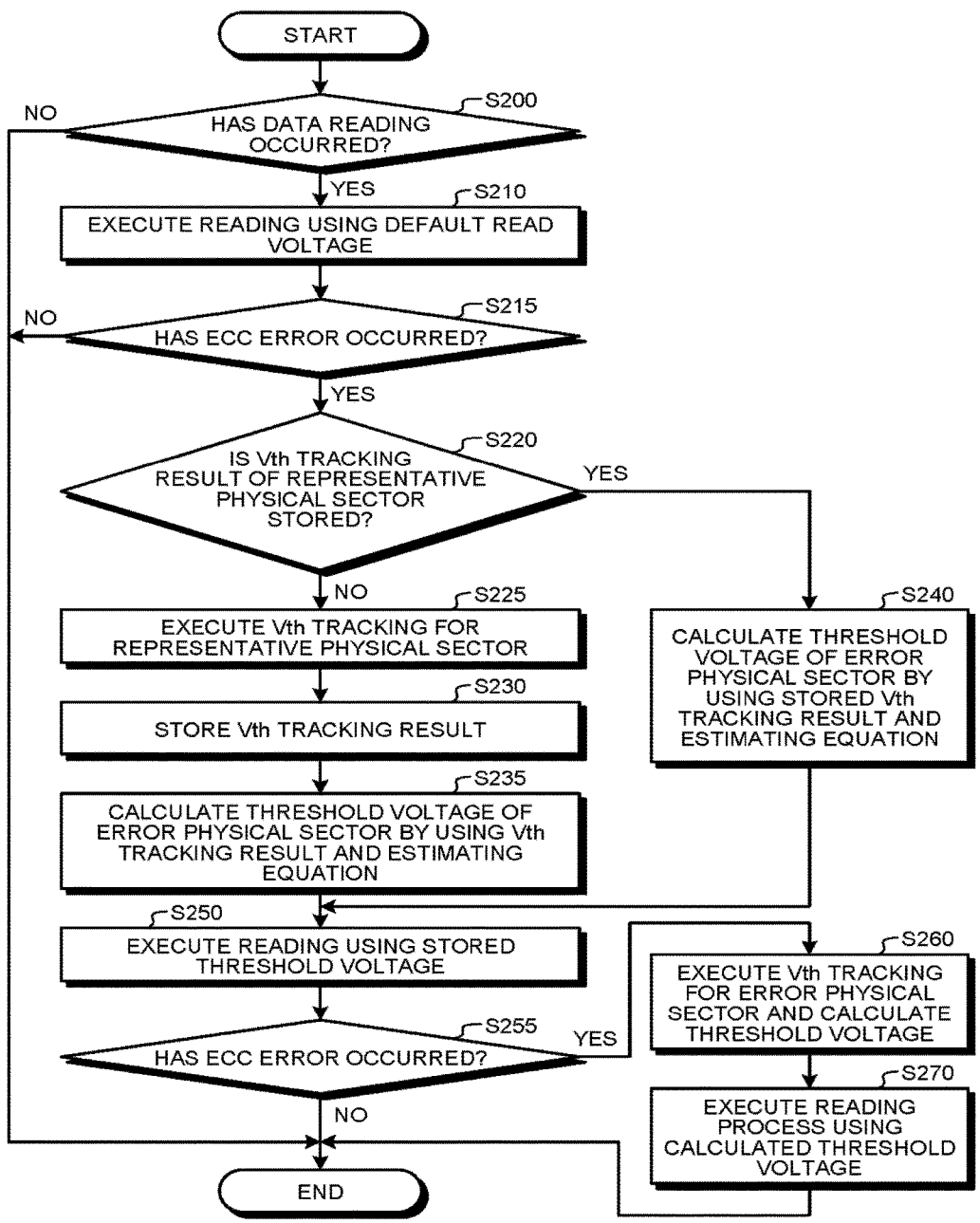
FIG. 9 is a flowchart that illustrates the operation according to the second embodiment.

FIG. 9 is a flowchart that illustrates an example of the operation of the memory system 100 according to the second embodiment. When reading of data stored in the NAND 10 has occurred (Step S200), the main control unit 21 executes control of the memory I/F 40 such that the data stored in the NAND 10 is read by using the default read voltage (Step S210). In a case where a read error occurs due to a failure in the error correction in the ECC unit 23 at the time of reading data using the default read voltage (Step S215: Yes), the threshold searching unit 24 determines whether or not a Vth tracking result relating to the representative physical sector of a physical block to which the physical sector (error sector) including a page, in which the read error has occurred, belongs is stored (Step S220).

In a case where the result of the determination of Step S220 is No, the threshold searching unit 24 executes the Vth tracking for the representative physical sector of the physical block to which the error physical sector belongs (Step S225) and stores the acquired Vth tracking result as the management information 32 (Step S230). The Vth tracking result of the representative physical sector that is stored as the management information 32 may be erased when the power of the memory system 100 is turned off or may be stored for the certain period described above.

Next, the threshold searching unit 24 calculates a read voltage for an error physical sector in which the read error has occurred based on the Vth tracking result of the representative physical sector and the set estimating equation described above and notifies the main control unit 21 of the calculated new read voltage (Step S235). The main control unit 21 executes control of the memory I/F 40 such that a page, in which the read error has occurred, is read using the notified read voltage (Step S250).

At the time of reading data using this new read voltage, in a case where an error correction is successful in the ECC unit 23 (Step S255: No), the subsequent process is executed by using the read data. In a case where the result of the determination of Step S255 is Yes, the threshold searching unit 24 executes the Vth tracking not for the representative physical sector but for a physical sector (error physical sector) including the page in which the read error has occurred, calculates a read voltage for the error physical sector, and notifies the main control unit 21 of the calculated new read voltage (Step S260). The main control unit 21 executes control of the memory I/F 40 such that the physical sector in which the read error has occurred is read by using the notified read voltage (Step S270).

On the other hand, in Step S220, in a case where a Vth tracking result relating to the representative physical sector of the physical block to which the error physical sector belongs is stored (Step S220: Yes), the threshold searching unit 24 calculates a read voltage for the error physical sector in which the read error has occurred based on the stored Vth tracking result of the representative physical sector and the set estimating equation described above and notifies the main control unit 21 of the calculated new read voltage (Step S240). The main control unit 21 executes control of the memory I/F 40 such that the page in which the read error has occurred is read by using the notified read voltage (Step S250). The processing sequence of such Steps S200 to S270 is executed when data stored in the NAND 10 is to be read.

In addition, in a case where the Vth tracking result of the representative physical block is stored, Steps S210 and S215 may be skipped.

In this way, according to the second embodiment, read voltages for the other physical sectors are calculated based on the Vth tracking result of a specific representative physical sector among a plurality of physical sectors disposed inside a physical block and the estimating equation. For this reason, the number of times of executing the Vth tracking is decreased, and the reading performance is improved.

Third Embodiment

Figure 10:
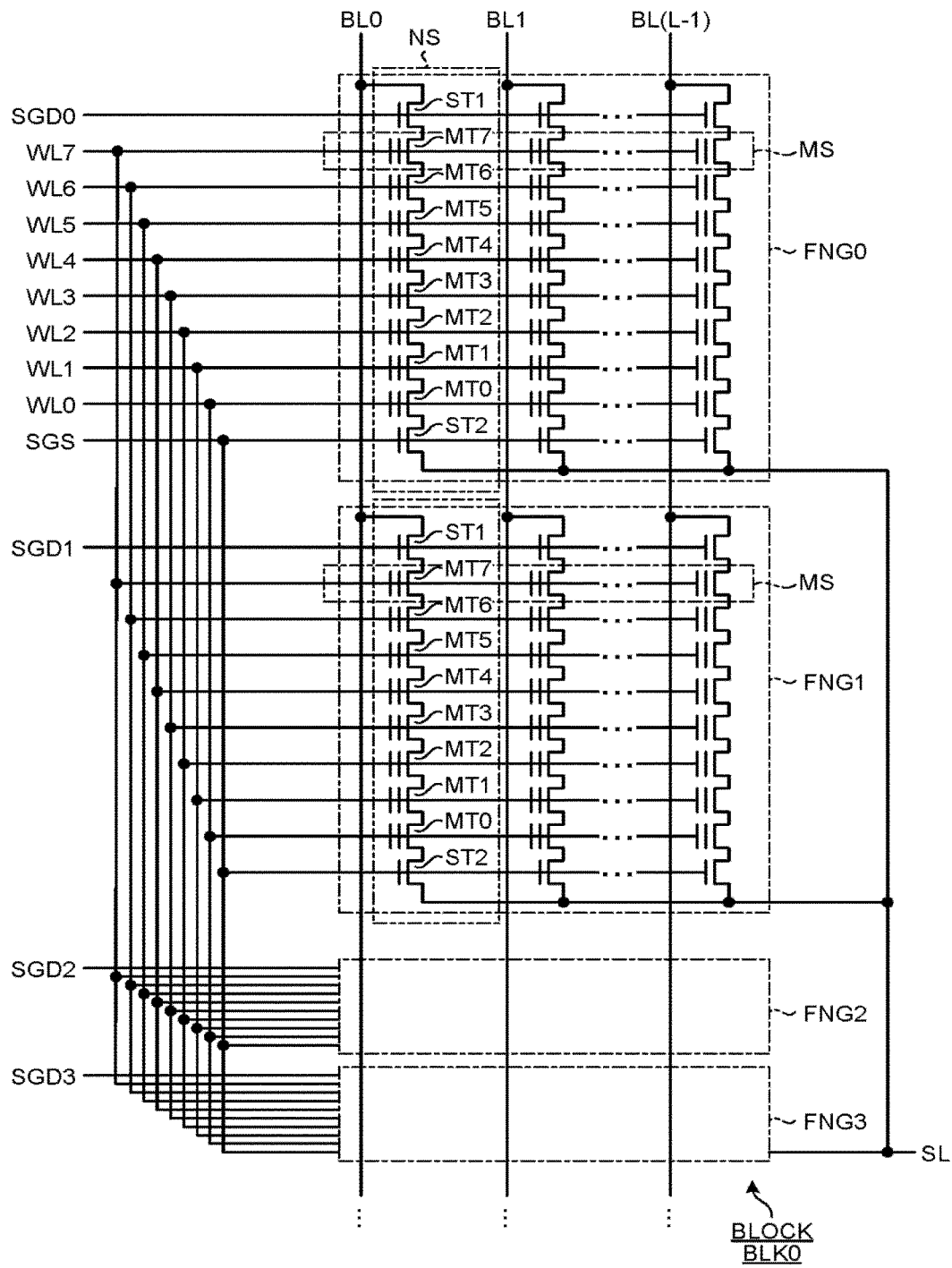
FIG. 10 is a circuit diagram that illustrates the internal configuration of a NAND flash memory having a three dimensional structure to which a third embodiment is applied.

In a third embodiment, there is a premise of a NAND 10 including a memory cell array having a three-dimensional structure. FIG. 10 is a diagram that illustrates an example of the configuration of a block of the memory cell array having the three-dimensional structure. FIG. 10 illustrates one block BLK0 among a plurality of blocks configuring the memory cell array having the three-dimensional structure. Any one of the other blocks of the memory cell array has the same configuration as that illustrated in FIG. 10.

As illustrated in the diagram, the block BLK0, for example, includes four fingers FNG (FNG0 to FNG3). In addition, each finger FNG includes a plurality of NAND strings NS. Each NAND string NS, for example, includes eight memory cell transistors MT (MT0 to MT7) and selection transistors ST1 and ST2. Here, the number of memory cell transistors MT is not limited to eight. The memory cell transistor MT is arranged between the selection transistors ST1 and ST2 such that the current paths thereof are connected in series. The current path of the memory cell transistor MT7 disposed on one end side of the series connection is connected to one end of the current path of the selection transistor ST1, and the current path of the memory cell transistor MT0 disposed on the other end side is connected to one end of the current path of the selection transistor ST2.

The gates of the selection transistors ST1 of the fingers FNG0 to FNG3 are commonly connected respectively to selection gate lines SGD0 to SGD3. On the other hand, the gates of the selection transistors ST2 are commonly connected to the same selection gate line SGS among a plurality of fingers FNG. In addition, the control gates of the memory cell transistors MT0 to MT7 disposed inside a same block BLK0 are commonly connected to word lines WL0 to WL7. In other words, while the word lines WL0 to WL7 and the selection gate lines SGS are commonly connected among the plurality of fingers FNG0 to FNG3 disposed inside a same block BLK, the selection gate line SGD is independent for each of the fingers FNG0 to FNG3 also inside the same block BLK.

The word lines WL0 to WL7 are connected to the control gate electrodes of the memory cell transistors MT0 to MT7 configuring the NAND string NS, and the memory cell transistors MTi (i=0 to n) of each NAND string NS are commonly connected by a same word line WLi (i=0 to n). In other words, the control gate electrodes of the memory cell transistors MTi disposed in the same row disposed inside the block BLK are connected to a same word line WLi.

Each memory cell is connected to a word line and a bit line. Each memory cell can be identified by using an address used for identifying a word line and select gate lines SGD3 to SGD3 and an address used for identifying a bit line. As described above, data of memory cells (memory cell transistors MT) disposed inside a same block BLK is erased together. On the other hand, data reading and data writing are executed in units of physical sectors MS. One physical sector MS is connected to one word line WL and includes a plurality of memory cells belonging to one finger FNG.

When a read operation or a programming operation is executed, one word line WL and one select gate line SGD are selected according to a physical address, whereby a physical sector MS is selected.

Figure 11:
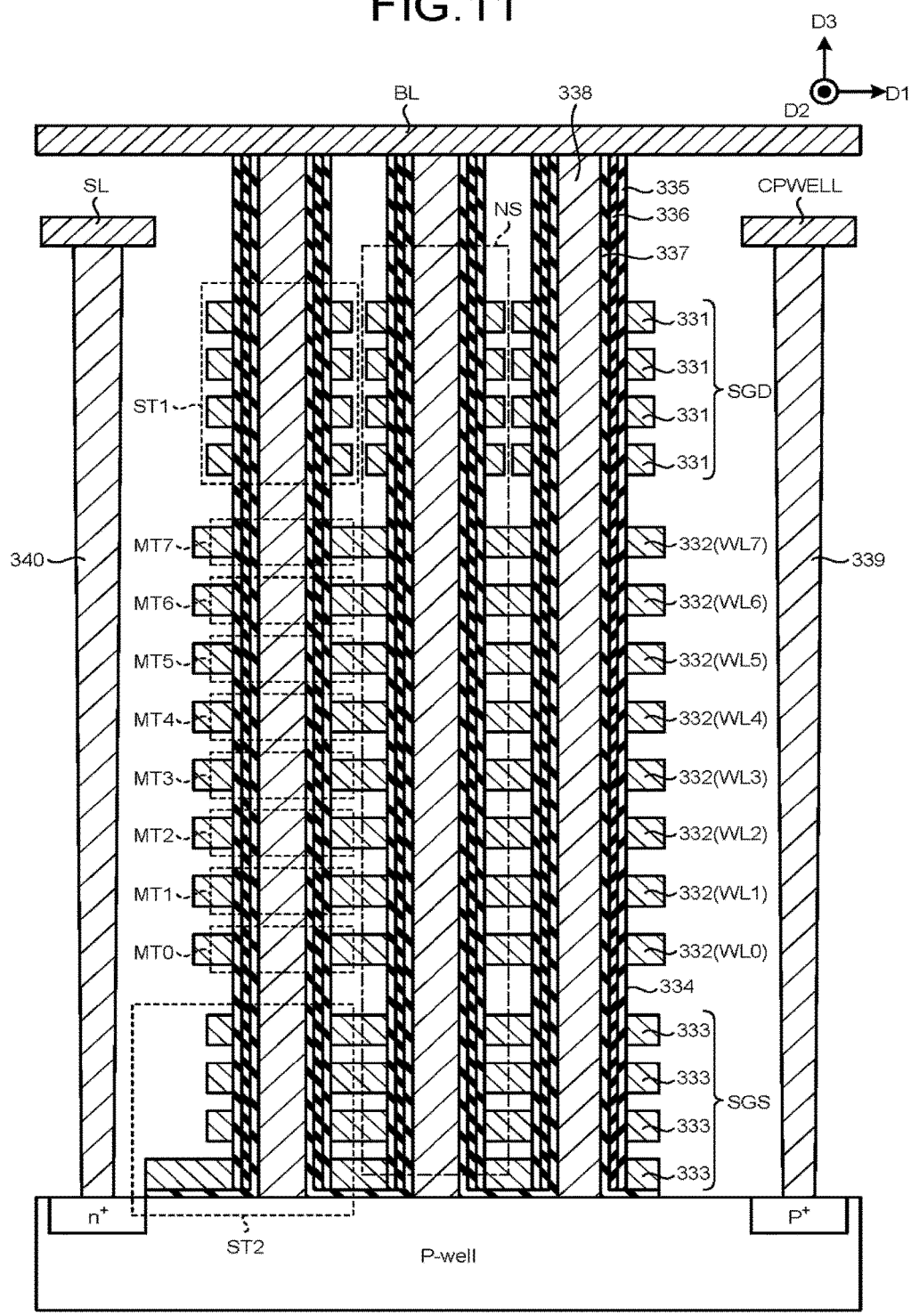
FIG. 11 is a cross-sectional view that illustrates the internal configuration of a NAND flash memory having the three dimensional structure to which the third embodiment is applied.

FIG. 11 is a cross-sectional view of a partial area of a memory cell array of a NAND memory having a three-dimensional structure. As illustrated in FIG. 11, a plurality of NAND strings NS are formed on a P-well region. In other words, on the P-well region, a plurality of wiring layers 333 functioning as selection gate lines SOS, a plurality of wiring layers 332 functioning as word lines WL, and a plurality of wiring layers 331 functioning as select gate lines SGD are formed.

A memory hole 334 that arrives at the P-well region through such wiring layers 333, 332, and 331 is formed. On the side face of the memory hole 334, a block insulating film 335, a charge storage layer 336, and a gate insulating film 337 are sequentially formed, and a conductive film 338 is embedded inside the memory hole 334. The conductive film 338 functions as a current path of the NAND string NS and is an area in which a channel is formed when the memory cell transistors MT and the selection transistors ST1 and ST2 operate.

In each NAND string NS, on the P-well region, the selection transistor ST2, a plurality of the memory cell transistors MT, and the selection transistor ST1 are sequentially stacked. At the upper end of the conductive film 338, a wiring layer functions as a hit line BL is formed.

In addition, inside the front face of the P-well region, an n+ type impurity diffusion layer and a p+ type impurity diffusion layer are formed. On the n+ type impurity diffusion layer, a contact plug 340 is formed, and a wiring layer functioning as a source line SL is formed on the contact plug 340. In addition, on the p+ type impurity diffusion layer, a contact plug 339 is formed, and a wiring layer functioning as a well wiring CPWELL is formed on the contact plug 339.

A plurality of the configurations illustrated in FIG. 11 are arranged in a depth direction of the paper face of FIG. 11, and one finger FNG is formed by a set of a plurality of NAND strings aligned in one line in the depth direction.

A plurality of physical sectors MS connected to one word line WL inside one physical block are formed in a same layer. In other words, a plurality of physical sectors MS connected to the word line WL0 inside the physical block BLK0 and a plurality of physical sectors MS connected to the word line WL1 inside the physical block BLK0 are formed at mutually-different layers.

Figure 12:
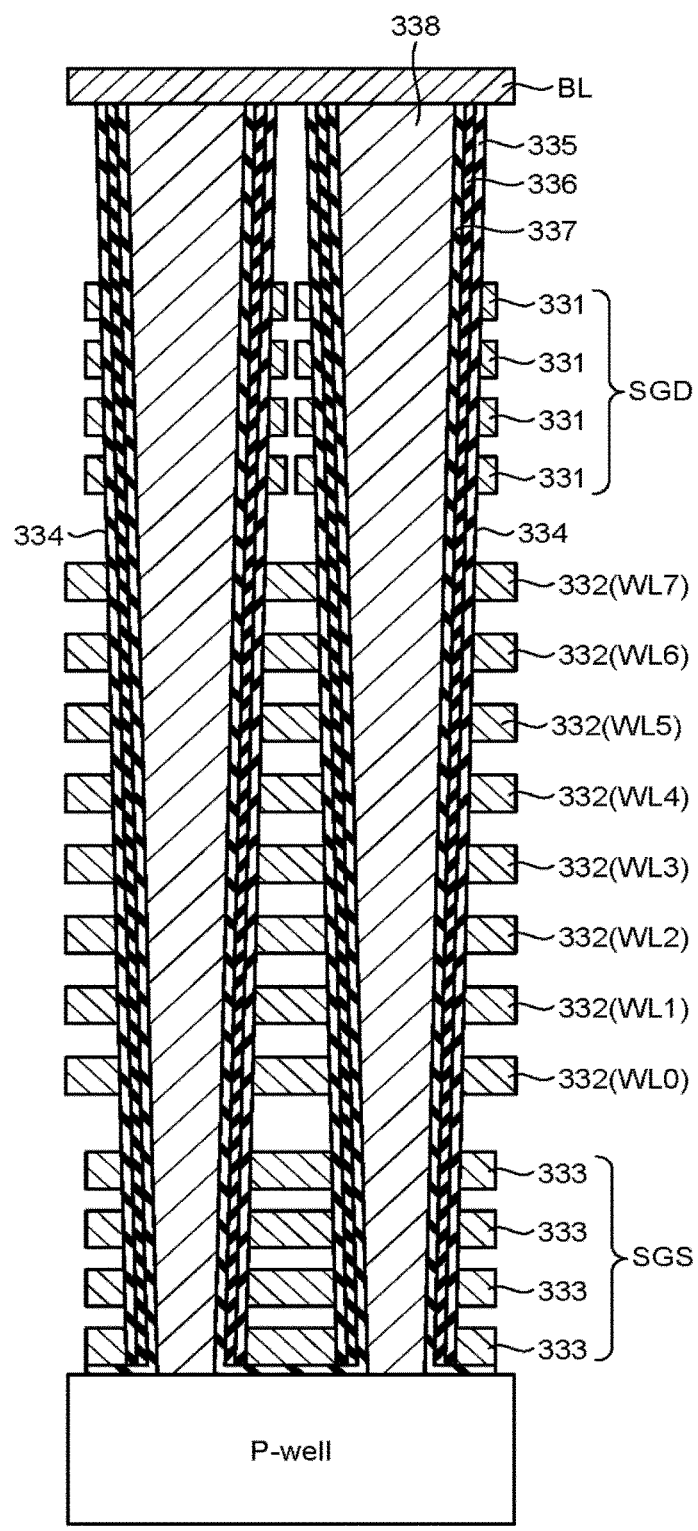
FIG. 12 is a cross-sectional view that illustrates the internal configuration of a NAND flash memory having the three dimensional structure to which the third embodiment is applied.

In a memory having a three-dimensional structure, while the three-dimensional structure is realized by allowing stacked silicon to pass through a memory hole 334, according to the characteristic of hole-passing manufacturing, there are cases where the diameter (or the length of the outer circumference) of the memory hole 334 is different according to the position (height). For example, there are cases where the memory hole 334, as illustrated in FIG. 12, has a tapered shape. FIG. 12 illustrates a cross-section of part of a cell array of a NAND memory having a three dimensional structure. In other words, the memory hole 334 has a smaller diameter in a portion closer to the P-well region. For this reason, the block insulating film 335, the charge storage layer 336, the gate insulating film 337, and the conductive film 338 have tapered shapes and have a smaller diameter in a portion closer to the P-well region.

In this way, in a memory having a three-dimensional structure, since there are cases where the memory hole 334 has a diameter that is different according to the position (height), there is a high possibility that a characteristic tendency occurs according to a difference of the position (height) of the memory cell in the reliability of the memory cell and the threshold voltage distribution of the memory cell. In other words, in the memory having the three-dimensional structure, there is a possibility that a characteristic tendency occurs between memory cells connected to mutually-different layers, in other words, between memory cells connected to mutually-different word lines.

Thus, in a third embodiment, a specific layer among a plurality of layers is set as a representative layer for which the Vth tracking is executed, and a relation including deviation amounts between the threshold voltage distributions of memory cells of this representative layer and memory cells of the other layers is acquired in advance at the time of manufacturing as an estimating equation. It is assumed that a read error has occurred in memory cells of a certain layer of a certain physical block. First, the Vth tracking is executed for the memory cells of the representative layer inside the physical block, and a result of the Vth tracking is acquired and stored. Next, a read voltage for the memory cells of the layer in which the read error has occurred is calculated based on the result of the Vth tracking acquired as described above and the estimating equation described above. Reading of the memory cells of the layer in which the read error has occurred is re-executed by using the calculated read voltage. Thereafter, it is assumed that a read error has occurred in the memory cells of another layer inside the physical block. At this time, a read voltage for the memory cells of the layer in which the read error has occurred is calculated based on the result of the Vth tracking of the memory cells of the representative layer stored as described above and the estimating equation described above.

Figure 13:
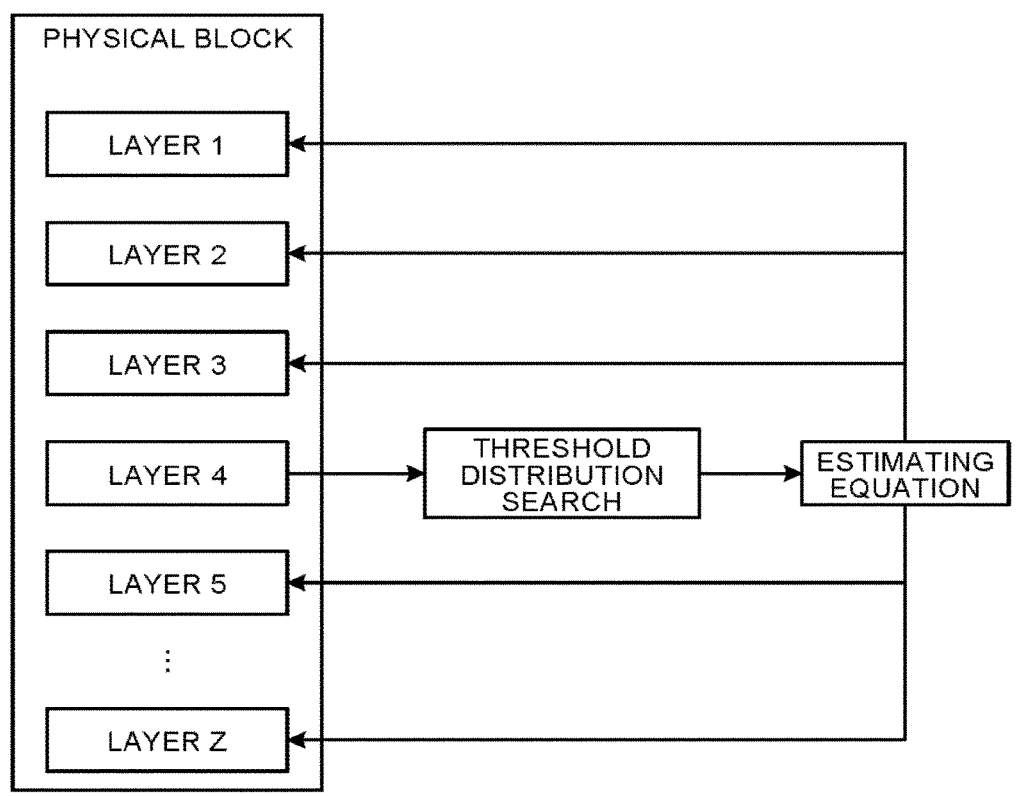
FIG. 13 is a diagram that conceptually illustrates an operation according to the third embodiment.

FIG. 13 is a diagram that conceptually illustrates an operation according to the third embodiment. As illustrated in FIG. 13, the physical block includes a plurality of physical sectors MS of layer 1, a plurality of physical sectors MS of layer 2, . . . , and a plurality of physical sectors MS of layer Z. In this physical block, a physical sector belonging to the finger FNG of one of the plurality of physical sectors MS of layer 4 is set as a physical sector (representative physical sector) that is a searching target as a target for the Vth tracking. A relation including deviation amounts between the threshold voltage distributions of the memory cells of layer 4 and the memory cells of the other layers is acquired in advance through an evaluation at the time of manufacturing or a process test and is set in the threshold searching unit 24 as an estimating equation. In a case where a read error has occurred in a physical sector of a layer other than layer 4, a read voltage for a physical sector of a layer other than layer 4 is calculated based on a result of the Vth tracking of a certain physical sector of layer 4 that is the representative physical sector and the estimating equation described above. In accordance with the erase count (or the write count) of the physical block, the deviation amount of the threshold voltage distribution set by the estimating equation may be changed.

FIG. 14 is a flowchart that illustrates an example of the operation of the memory system 100 according to the third embodiment. When reading of data stored in the NAND 10 has occurred (Step S300), the main control unit 21 executes control of the memory I/F 40 such that the data stored in the NAND 10 is read by using the default read voltage (Step S310). In a case where a read error occurs due to a failure in the error correction in the ECC unit 23 at the time of reading data using the default read voltage (Step S315: Yes), the threshold searching unit 24 determines whether or not a Vth tracking result relating to the physical sector of the representative layer of the physical block to which a physical sector (error sector) of a certain layer including a page in which the read error has occurred belongs is stored (Step S320).

In a case where the result of the determination of Step S320 is No, the threshold searching unit 24 executes the Vth tracking for the physical sector of the representative layer of the physical block to which the error physical sector belongs (Step S325) and stores the acquired Vth tracking result as the management information (Step S330). The Vth tracking result of the representative physical sector of the representative layer that is stored as the management information 32 may be erased when the power of the memory system 100 is turned off or may be stored for the certain period described above.

Next, the threshold searching unit 24 calculates a read voltage for the physical sector of the layer in which the read error has occurred based on the Vth tracking result of the physical sector of the representative layer and the set estimating equation described above and notifies the main control unit 21 of the calculated new read voltage (Step S335). The main control unit 21 executes control of the memory I/F 40 such that a page, in which the read error has occurred, is read using the notified read voltage (Step S350).

At the time of reading data using this new read voltage, in a case where an error correction is successful in the ECC unit 23 (Step S355: No), the subsequent process is executed by using the read data. In a case where the result of the determination of Step S355 is Yes, the threshold searching unit 24 executes the Vth tracking not for the physical sector of the representative layer but for a certain physical sector (a physical sector of the error layer) of the layer including the page in which the read error has occurred, calculates a read voltage for the physical sector of the error layer, and notifies the main control unit 21 of the calculated new read voltage (Step S360). As the physical sector of the error layer, while a physical sector to which the page, in which the read error has occurred, belongs is preferable, another physical sector of the same layer as that of the physical sector to which the page in which the read error has occurred belongs may be used. The main control unit 21 executes control of the memory I/F 40 such that the physical sector of the layer in which the read error has occurred is read by using the notified read voltage (Step S370).

On the other hand, in Step S320, in a case where a Vth tracking result relating to the physical sector of the representative layer of the physical block to which the physical sector of the error layer belongs is stored (Step S320: Yes), the threshold searching unit 24 calculates a read voltage for the physical sector of the error layer in which the read error has occurred based on the stored Vth tracking result of the physical sector of the representative layer and the set estimating equation described above and notifies the main control unit 21 of the calculated new read voltage (Step S340). The main control unit 21 executes control of the memory I/F 40 such that the page in which the read error has occurred is read by using the notified read voltage (Step S350). The processing sequence of such Steps S300 to S370 is executed when data stored in the NAND 10 is to be read.

In addition, in a case where the Vth tracking result of the representative physical block is stored, Steps S310 and S315 may be skipped.

In the description presented above, while the read voltage is calculated in consideration of only a difference in the layer inside the block, a difference in the finger FNG may be considered. For example, a physical sector of a representative layer is set for each finger FNG, and the relation equation between the memory cells belonging to the physical sector of the representative layer and the memory cells of the other layers is acquired in advance at the time of manufacturing for each finger FNG. It is assumed that a read error has occurred in memory cells of a certain layer of a certain finger FNG0 of a certain physical block. First, the Vth tracking is executed for the memory cells of the representative layer inside the finger FNG0 of this physical block, and a result of the Vth tracking is acquired and stored. Next, a read voltage for the memory cells of the layer in which the read error has occurred inside the finger FNG0 is calculated based on the acquired result of the Vth tracking and the estimating equation. Reading of the memory cells of the layer in which the read error has occurred inside the finger FNG0 is re-executed by using the calculated read voltage. Thereafter, it is assumed that a read error has occurred in the memory cells of another layer of the finger FNG0 inside this physical block. At this time, a read voltage for the memory cells of the layer in which the read error has occurred inside the finger FNG0 is calculated based on the stored result of the Vth tracking of the memory cells of the representative layer inside the finger FNG0 and the estimating equation.

In this way, according to the third embodiment, read voltages for the physical sectors of the other layers are calculated based on the Vth tracking result of the physical sector of a specific representative layer inside the physical block of the memory having the three-dimensional structure and the estimating equation. For this reason, the number of times of executing the Vth tracking is decreased, and the reading performance is improved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
   a nonvolatile memory including a plurality of blocks, the block including a plurality of physical sectors, the physical sector including memory cells connected to a word line; and
   a controller configured to control the nonvolatile memory on a basis of a processing unit among a plurality of processing units, and configured to:
      perform a distribution read on a first processing unit, the distribution read including searching a threshold voltage distribution of first memory cells corresponding to the first processing unit by reading data from the first memory cells a plurality of times with a different read voltage in each time, and acquire a first read voltage based on the searched threshold voltage distribution;
      calculate a second read voltage based on the acquired first read voltage and a first relation, the second read voltage being a read voltage for second memory cells corresponding to a second processing unit, the first relation including a deviation amount between a threshold voltage distribution of the first processing unit and a threshold voltage distribution of the second processing unit, the second processing unit being a processing unit different from the first processing unit; and
      read data from third memory cell among the second memory cells by using the calculated second read voltage.

2. The memory system according to claim 1, wherein, in a case where an error correction process of the data read from the third memory cell fails, the controller determines whether or not the first read voltage is acquired and performs the distribution read on the first processing unit in a case where the first read voltage is not acquired.

3. The memory system according to claim 1, wherein, in a case where an error correction process of the data read from the third memory cells fails, the controller determines whether or not the first read voltage is acquired and calculates the second read voltage by using the acquired first read voltage instead of performing the distribution read on the first processing unit in a case where the first read voltage is acquired.

4. The memory system according to claim 2, wherein, in a case where an error correction process of the data read from the third memory cell using the second read voltage fails, the controller performs the distribution read on the second processing unit, and acquires a third read voltage, and re-reads data from the third memory cell by using the acquired third read voltage.

5. The memory system according to claim 1, wherein the processing unit is a block, and the plurality of processing units are a plurality of the blocks, which are associated with a logical block, capable of executing parallel operations.

6. The memory system according to claim 1, wherein the processing unit is a block, and the plurality of processing units are a plurality of blocks of which data is written during a same period.

7. The memory system according to claim 1, wherein the processing unit is a physical sector, and the plurality of processing units are a plurality of physical sectors included in a same block.

8. The memory system according to claim 1, wherein the nonvolatile memory has a two-dimensional structure.

9. The memory system according to claim 1, wherein the nonvolatile memory has a three-dimensional structure, and the plurality of physical sectors are arranged in mutually-different layers.

10. The memory system according to claim 9, wherein the first relation includes a deviation amount between a threshold voltage distribution of memory cells of a first layer in which first physical sectors are arranged and a threshold voltage distribution of memory cells of a second layer in which second physical sectors are arranged.

11. A method of controlling a nonvolatile memory, the nonvolatile memory including a plurality of blocks, the block including a plurality of physical sectors, the physical sector including memory cells connected to a same word line, the method comprising:
controlling the nonvolatile memory on a basis of a processing unit among a plurality of processing units,
performing, using circuitry, a distribution read on a first processing unit, the distribution read including searching a threshold voltage distribution of first memory cells corresponding to the first processing unit by reading data from the first memory cells a plurality of times with a different read voltage in each time, and acquiring a first read voltage based on the searched threshold voltage distribution;
calculating, using the circuitry, a second read voltage based on the acquired first read voltage and a first relation, the second read voltage being a read voltage for second memory cells corresponding to a second processing unit, the first relation including a deviation amount between a threshold voltage distribution of the first processing unit and a threshold voltage distribution of the second processing unit, the second processing unit being a processing unit different from the first processing unit; and
reading data from third memory cell among the second memory cells by using the calculated second read voltage.

12. The method according to claim 11, further comprising, in a case where an error correction process of the data read from the third memory cell fails, determining whether or not the first read voltage is acquired and performing the distribution read on the first processing unit in a case where the first read voltage is not acquired.

13. The method according to claim 11, further comprising, in a case where an error correction process of the data read from the third memory cell fails, determining whether or not the first read voltage is acquired and calculating the second read voltage by using the acquired first read voltage instead of performing the distribution read on the first processing unit in a case where the first read voltage is acquired.

14. The method according to claim 12, further comprising, in a case where an error correction process of the data read from the third memory cell using the second read voltage fails, performing the distribution read on the second processing unit, acquiring a third read voltage, and re-reading data from the third memory cell by using the acquired third read voltage.

15. The method according to claim 11, wherein the processing unit is a block, and the plurality of processing units are a plurality of the blocks, which are associated with a logical block, capable of executing parallel operations.

16. The method according to claim 11, wherein the processing unit is a block, and the plurality of processing units are a plurality of blocks of which data is written during a same period.

17. The method according to claim 11, wherein the processing unit is a physical sector, and the plurality of processing units are a plurality of physical sectors included in a same block.

18. The method according to claim 11, wherein the nonvolatile memory has a two-dimensional structure.

19. The method according to claim 11, wherein the nonvolatile memory has a three-dimensional structure, and the plurality of physical sectors are arranged in mutually-different layers.

20. The method according to claim 19, wherein the first relation includes a deviation amount between a threshold voltage distribution of memory cells of a first layer in which first physical sectors are arranged and a threshold voltage distribution of memory cells of a second layer in which second physical sectors are arranged.

* * * * *